United States Patent
Ishikawa et al.

(10) Patent No.: US 10,043,604 B2
(45) Date of Patent: Aug. 7, 2018

(54) VOLTAGE-NONLINEAR RESISTOR ELEMENT AND METHOD FOR PRODUCING THE SAME

(71) Applicant: NGK INSULATORS, LTD., Nagoya (JP)

(72) Inventors: Masaki Ishikawa, Kiyosu (JP); Toru Hayase, Nagoya (JP); Yoshimasa Kobayashi, Nagoya (JP); Kenji Morimoto, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 5 days.

(21) Appl. No.: 15/468,630

(22) Filed: Mar. 24, 2017

(65) Prior Publication Data
US 2017/0278601 A1    Sep. 28, 2017

(30) Foreign Application Priority Data
Mar. 28, 2016   (JP) .................................. 2016-063624

(51) Int. Cl.
| | |
|---|---|
| *H01C 7/18* | (2006.01) |
| *H01C 17/30* | (2006.01) |
| *H01C 7/102* | (2006.01) |
| *H01C 7/112* | (2006.01) |
| *C04B 35/453* | (2006.01) |

(52) U.S. Cl.
CPC ............... *H01C 7/18* (2013.01); *H01C 7/102* (2013.01); *H01C 7/112* (2013.01); *H01C 17/30* (2013.01); *C04B 35/453* (2013.01)

(58) Field of Classification Search
CPC .................................. H01C 7/18; H01C 17/30

USPC ............................................ 338/204, 21, 13
See application file for complete search history.

(56) References Cited

U.S. PATENT DOCUMENTS

| | | | |
|---|---|---|---|
| 4,243,622 A | | 1/1981 | Kresge |
| 4,272,754 A | * | 6/1981 | Lou ....................... H01C 7/1013 257/43 |
| 4,473,812 A | * | 9/1984 | Maruyama ............. H01C 7/112 252/519.52 |
| 4,516,105 A | * | 5/1985 | Imai ...................... H01C 7/112 264/617 |
| 5,699,035 A | * | 12/1997 | Ito ..................... C23C 16/45561 257/E21.009 |

(Continued)

FOREIGN PATENT DOCUMENTS

| | | |
|---|---|---|
| EP | 0 040 043 A2 | 11/1981 |
| JP | 04-111922 B2 | 11/1995 |

OTHER PUBLICATIONS

Extended European Search Report (Application No. 17163125.2) dated May 29, 2017.

*Primary Examiner* — Kyung Lee
(74) *Attorney, Agent, or Firm* — Burr & Brown, PLLC

(57) ABSTRACT

A voltage-nonlinear resistor element 10 includes a voltage-nonlinear resistor (referred simply as "resistor") 20 and a pair of electrodes 14 and 16 between which the resistor 20 is interposed. The resistor 20 has a multilayer structure including a first layer 21 composed primarily of zinc oxide, a second layer 22 composed primarily of zinc oxide, and a third layer 23 composed primarily of a metal oxide other than zinc oxide. The second layer 22 is adjacent to the first layer 21 and has a smaller thickness and a higher volume resistivity than the first layer 21. The third layer 23 is adjacent to the second layer 22.

7 Claims, 2 Drawing Sheets

(56) References Cited

U.S. PATENT DOCUMENTS 5,707,583 A 1/1998 Yodogawa
8,865,028 B2 * 10/2014 Hong .................... C04B 35/453
                                                         252/519.51

* cited by examiner

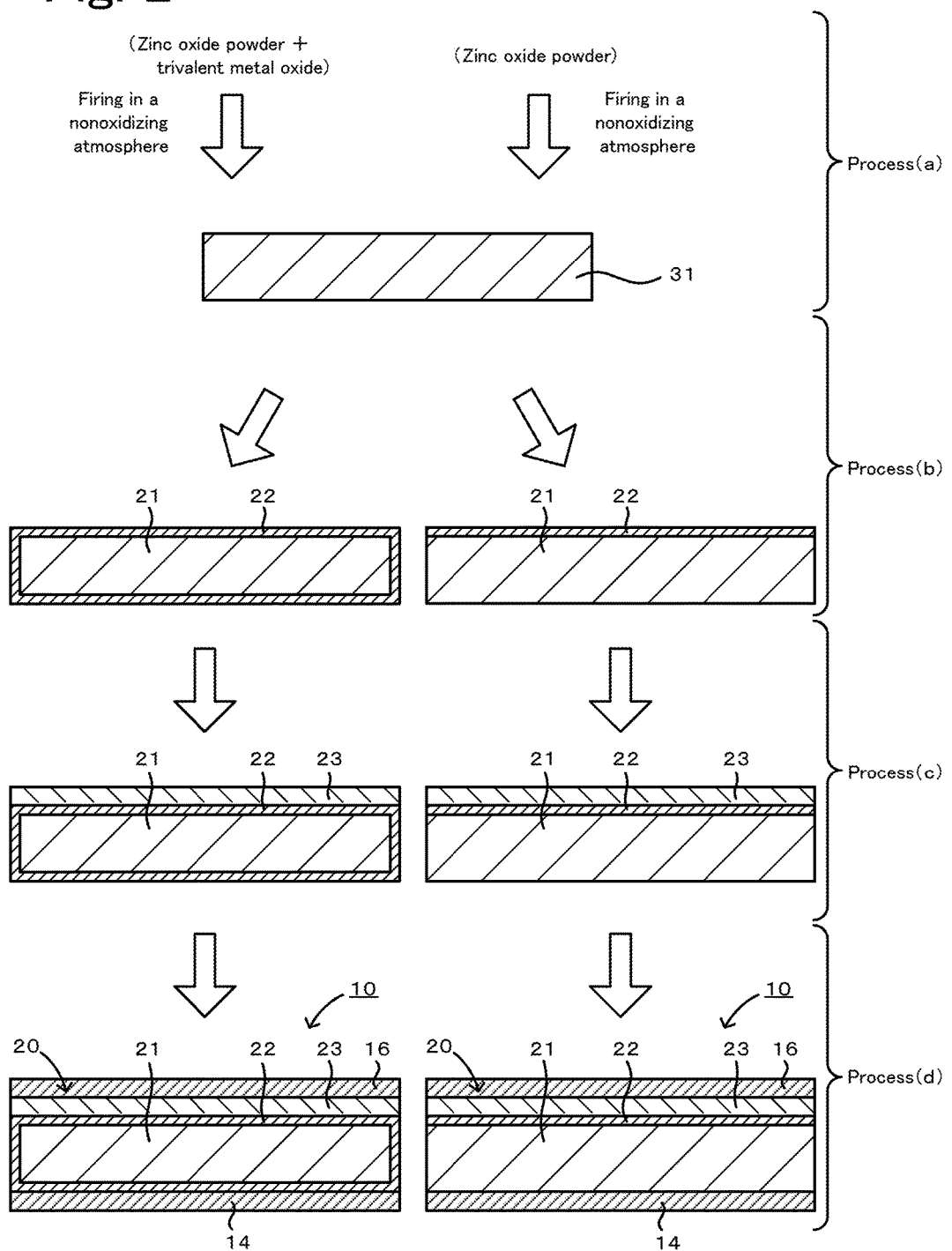

VOLTAGE-NONLINEAR RESISTOR ELEMENT AND METHOD FOR PRODUCING THE SAME

BACKGROUND OF THE INVENTION

1. Field of the Invention

The present invention relates to a voltage-nonlinear resistor element and a method for producing the voltage-nonlinear resistor element.

2. Description of the Related Art

Voltage-nonlinear resistor elements (i.e., varistor elements), which are elements having a structure including a pair of electrodes and a voltage-nonlinear resistor interposed therebetween, have been widely used as elements that protect an electronic circuit or the like from an abnormal voltage in various sensors such as humidity sensors and temperature sensors. An example of voltage-nonlinear resistor elements is disclosed in Patent Literature 1, the element including a portion in which a region composed primarily of zinc oxide and a region including a bismuth-alkaline earth-copper composite oxide are joined to each other. The above voltage-nonlinear resistor element is produced by the following production method. A zinc oxide powder is formed into a compact by a common shaping method. The compact is fired at 1250° C. for 2 hours in air. Both surfaces of the resulting sintered compact are polished. Specifically, one of the surfaces of the sintered compact is mirror-polished with an alumina fine powder. After the polished sintered compact has been cleaned with an organic solvent to a sufficient degree, a sputtered film composed of a Bi-alkaline earth-Cu oxide is formed on the mirror-polished surface of the zinc oxide sintered compact with a high-frequency sputtering apparatus. Then, a heat treatment is performed in an oxygen atmosphere at 870° C. for 24 hours.

CITATION LIST

Patent Literature

PTL 1: JP7-111922B2

SUMMARY OF THE INVENTION

Voltage nonlinearity index is a measure of the amount of current that flows through a circuit connected in shunt with a voltage-nonlinear resistor element, with the aim of protecting the circuit, during normal operation. The higher the voltage nonlinearity index, the larger the amount of current that flows through the circuit during normal operation. This reduces energy consumption. However, since the voltage nonlinearity index of the voltage-nonlinear resistor element disclosed in Patent Literature 1 is only about 8, the voltage-nonlinear resistor element disclosed in Patent Literature 1 may fail to reduce energy consumption to a sufficient degree.

The present invention was made in order to address the above-described issues. The main object of the present invention is to provide a voltage-nonlinear resistor element having a structure including a zinc oxide region and a region including a metal oxide other than zinc oxide which are adjacent to each other, the voltage-nonlinear resistor element having a higher voltage nonlinearity index than the voltage-nonlinear resistor elements of the related art.

A voltage-nonlinear resistor element according to the present invention includes:

a first layer composed primarily of zinc oxide;

a second layer adjacent to the first layer, the second layer being composed primarily of zinc oxide and having a smaller thickness and a higher volume resistivity than the first layer; and a third layer adjacent to the second layer on a side of the second layer which is opposite to the side on which the second layer is adjacent to the first layer, the third layer being composed primarily of a metal oxide other than zinc oxide.

In the above-described voltage-nonlinear resistor element, a second layer that is composed primarily of zinc oxide and has a smaller thickness and a higher volume resistivity than the first layer is interposed between a first layer composed primarily of zinc oxide and a third layer composed primarily of a metal oxide other than zinc oxide. The presence of the second layer increases the voltage nonlinearity index of the voltage-nonlinear resistor element compared with the voltage-nonlinear resistor elements of the related art and, as a result, reduces the amount of current that flows through the voltage-nonlinear resistor element connected in shunt with a circuit that is to be protected during normal operation, that is, while the amount of voltage is low. This reduces energy consumption.

A component of which a layer is "composed primarily", that is, "primary component", is a component having the largest content, such as a component having the highest mass proportion.

In the voltage-nonlinear resistor element according to the present invention, the first layer preferably has a volume resistivity of $1 \times 10^{-2}$ Ωcm or less, and the second layer preferably has a volume resistivity of $1 \times 10^{3}$ Ωcm or less. In such a case, the voltage-nonlinear resistor element has a sufficiently high voltage nonlinearity index. It is more preferable that the first layer have a volume resistivity of $6 \times 10^{-4}$ Ωcm or less and the second layer have a volume resistivity of $2 \times 10^{-3}$ Ωcm or less. In such a case, a large amount of current may flow through the voltage-nonlinear resistor element connected in shunt with a circuit that is to be protected upon a surge voltage being applied to the voltage-nonlinear resistor element. This enhances the circuit protection effect.

In the voltage-nonlinear resistor element according to the present invention, the second layer preferably has a thickness of 0.2 to 300 nm. In such a case, the voltage-nonlinear resistor element has a sufficiently high voltage nonlinearity index.

In the voltage-nonlinear resistor element according to the present invention, the first layer may include an oxide of at least one metal element selected from the group consisting of Al, Ga, and In. The addition of these trivalent metal ions enables the volume resistivity of the first layer, which is composed primarily of zinc oxide, to be reduced in a relatively easy manner.

In the voltage-nonlinear resistor element according to the present invention, it is preferable that the third layer be composed primarily of an oxide of a metal element selected from the group consisting of Sr, Bi, and Pr and include an oxide of at least one metal element selected from the group consisting of Si, Cr, Mn, Co, Ni, Zn, Sb, and La. In such a case, voltage-nonlinear resistor elements having various properties may be produced by changing the type of a metal included in the other metal oxide added to the metal oxide that serves as a primary component and the amount of the other metal oxide.

A method for producing a voltage-nonlinear resistor element according to the present invention, that is, a method for producing any one of the above-described voltage-nonlinear resistor elements, the method including:

(a) firing a compact formed of a zinc oxide powder that may include at least one metal element selected from the group consisting of Al, Ga, and In in a nonoxidizing atmosphere in order to prepare a zinc oxide ceramic substrate (b) firing the zinc oxide ceramic substrate in an oxidizing atmosphere in order to convert a surface layer of the zinc oxide ceramic substrate into a layer having a higher volume resistivity than the inside of the zinc oxide ceramic substrate, the inside and the surface layer of the zinc oxide ceramic substrate serving as the first layer and the second layer, respectively, or forming a zinc oxide layer on a surface of the zinc oxide ceramic substrate, the zinc oxide layer being composed primarily of zinc oxide and having a smaller thickness and a higher volume resistivity than the zinc oxide ceramic substrate, the zinc oxide ceramic substrate and the zinc oxide layer serving as the first layer and the second layer, respectively; and (c) forming the third layer on a surface of the second layer.

By this method, the above-described voltage-nonlinear resistor element may be readily produced.

BRIEF DESCRIPTION OF THE DRAWINGS

FIG. 2 is a diagram illustrating the process for producing a voltage-nonlinear resistor element 10.

DETAILED DESCRIPTION OF THE INVENTION

Figure 1:
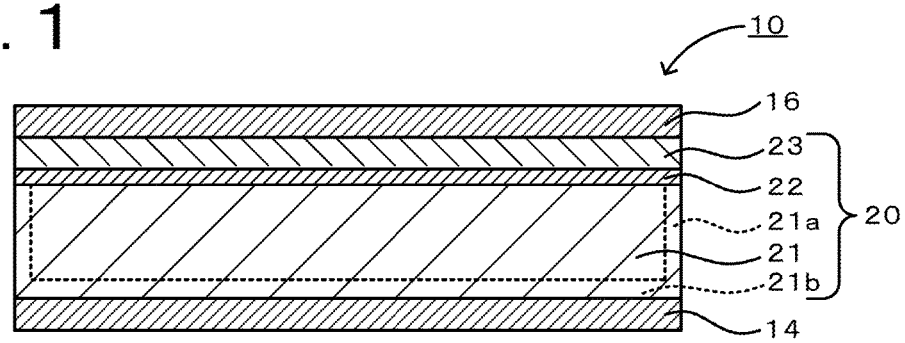
FIG. 1 is a cross-sectional view of a voltage-nonlinear resistor element 10.

A preferred embodiment of the present invention is described below with reference to the attached drawings. FIG. 1 is a cross-sectional view of a voltage-nonlinear resistor element 10 according to the embodiment.

The voltage-nonlinear resistor element 10 includes a voltage-nonlinear resistor (hereinafter, referred to simply as "resistor") 20 and a pair of electrodes 14 and 16 between which the resistor 20 is interposed.

The resistor 20 has a structure constituted by a first layer 21 composed primarily of zinc oxide, a second layer 22 composed primarily of zinc oxide, and a third layer 23 composed primarily of a metal oxide other than zinc oxide. The second layer 22 is adjacent to the first layer 21 and has a smaller thickness and a lower carrier concentration than the first layer 21. The third layer 23 is adjacent to the second layer 22. Side surfaces 21a and a lower surface 21b of the first layer 21 may have the same composition as the first layer 21 or the second layer 22.

The volume resistivity of the first layer 21 is preferably $1.0 \times 10^{-2}$ Ωcm or less, is more preferably $1.0 \times 10^{-3}$ Ωcm or less, and is further preferably $6.0 \times 10^{-4}$ Ωcm or less. The volume resistivity of the second layer 22 is higher than that of the first layer 21, is preferably $1 \times 10^{3}$ Ωcm or less, is more preferably $3 \times 10^{2}$ Ωcm or less, and is further preferably $2 \times 10^{-3}$ Ωcm or less. The thickness of the second layer 22 is preferably, but not limited to, 0.2 to 300 nm, is more preferably 0.2 to 10 nm, and is further preferably 1 to 10 nm. The first layer 21 may include an oxide of at least one metal element selected from the group consisting of Al, Ga, and In. It is preferable that the third layer 23 be composed primarily of an oxide of a metal element selected from the group consisting of Sr, Bi, and Pr and include an oxide of at least one metal element selected from the group consisting of Si, Cr, Mn, Co, Ni, Zn, Sb, and La.

The electrode 14 is arranged to be adjacent to the outer surface of the first layer 21. The electrode 16 is arranged to be adjacent to the outer surface of the third layer 23. The electrodes 14 and 16 may be composed of any material that has a good ohmic property with a zinc oxide ceramic and a good electrical conduction property. Examples of such a material include gold, silver, platinum, and aluminum.

An example method for producing the voltage-nonlinear resistor element 10 is described below. FIG. 2 illustrates a process for producing the voltage-nonlinear resistor element 10.

Preparation of Zinc Oxide Ceramic Sheet (See Step (a) of FIG. 2)

The volume resistivity of a zinc oxide ceramic sheet 31 is preferably $1.0 \times 10^{-2}$ Ωcm or less, is more preferably $1.0 \times 10^{-3}$ Ωcm or less, and is further preferably $6.0 \times 1.0^{-4}$ Ωcm or less. The above zinc oxide ceramic sheet 31 may be formed by dissolving trivalent ions serving as a dopant, such as Al ions, Ga ions, or In ions, in a zinc oxide ceramic or by firing a zinc oxide powder in a nonoxidizing atmosphere such that oxygen defect occurs. A zinc oxide ceramic sheet 31 including the dopant dissolved therein may be produced in the following manner. First, a powder of a trivalent metal oxide such as $Al_2O_3$, $Ga_2O_3$, or $In_2O_3$ is mixed with a zinc oxide powder such that the content of the trivalent metal oxide powder is 0.05% to 2.0% by mass. The resulting mixed powder is formed into a compact having a predetermined shape. The compact is held at 900° C. to 1200° C. for a few hours in a nonoxidizing atmosphere (e.g., a nitrogen atmosphere or an argon atmosphere), subsequently heated to 1300° C. to 1500° C., and fired for a few hours. The zinc oxide ceramic sheet 31 can be formed relatively easily in the above manner. The carrier concentration and the volume resistivity of the zinc oxide ceramic sheet 31 can be controlled to be desired values by adjusting the content (mass %) of the trivalent metal oxide powder mixed with the zinc oxide powder or the firing temperature. The average particle diameter (laser diffractometry, the same applies hereinafter) of the zinc oxide powder used as a raw material is preferably 0.02 to 5 μm. The average particle diameter of the trivalent metal oxide powder is preferably 0.01 to 0.5 μm. A zinc oxide ceramic sheet 31 having a low volume resistivity which is formed by firing a zinc oxide powder in a nonoxidizing atmosphere may be produced by, for example, holding a zinc oxide powder at 1300° C. to 1500° C. for a few hours in a nonoxidizing atmosphere (e.g., a nitrogen atmosphere or an argon atmosphere) in order to fire the zinc oxide powder. The above-described zinc oxide ceramic sheet 31 may be prepared by cutting a zinc oxide ceramic block prepared by the same method as described above.

Preparation of High-Volume-Resistivity Layer (See Step (b) of FIG. 2)

(Part 1)

The zinc oxide ceramic sheet 31 is fired in an oxidizing atmosphere (e.g., an oxygen atmosphere or an air atmosphere) in order to convert each surface layer of the zinc oxide ceramic sheet into a layer having a higher volume resistivity than the inside of the zinc oxide ceramic sheet. As a result, the inside of the zinc oxide ceramic sheet 31 serves as a first layer 21, and the surface layers of the zinc oxide ceramic sheet 31 serve as a second layer 22. The first layer 21 and the second layer 22 have the above-described volume resistivities. The firing temperature is preferably 600° C. to 1000° C. and is more preferably 700° C. to 900° C. The firing time is set appropriately such that the volume resistivities of the first layer 21 and the second layer 22 each fall within the above-described range and may be set to, for example, 0.1 to 1 hour.

(Part 2)

A zinc oxide layer that is composed primarily of zinc oxide and has a smaller thickness and a higher volume resistivity than the zinc oxide ceramic sheet 31 is formed on the upper surface of the zinc oxide ceramic sheet 31. The zinc oxide ceramic sheet 31 and the zinc oxide layer serve as a first layer 21 and a second layer 22, respectively. The first layer 21 and the second layer 22 have the above-described volume resistivities. In the case where the zinc oxide layer includes only zinc oxide, the zinc oxide layer may be formed on the zinc oxide ceramic sheet by sputtering using zinc oxide as a target. Vacuum deposition, ion plating, and the like may be used instead of sputtering. In the case where the zinc oxide layer includes a subcomponent, the zinc oxide layer may be formed on the zinc oxide ceramic sheet by multi-target simultaneous sputtering using zinc oxide and the subcomponent as targets. The zinc oxide layer may alternatively be formed by applying a paste including a zinc oxide powder to the zinc oxide ceramic sheet, drying the resulting coating film, and performing a heat treatment at a relatively low temperature (e.g., 200° C. to 700° C. and preferably 200° C. to 500° C.)

Preparation of Metal Oxide Layer (See Step (c) of FIG. 2)

The metal oxide layer (i.e., the third layer 23) may include only bismuth oxide. In another case, the metal oxide layer may be composed primarily of bismuth oxide and an oxide other than bismuth oxide (e.g., $Sb_2O_3$, $Cr_2O_3$, MnO, CoO, ZnO, or $SiO_2$) which serves as a subcomponent. In the case where the bismuth oxide layer includes only bismuth oxide, the bismuth oxide layer may be formed as a third layer 23 on the second layer 22 by sputtering using bismuth oxide as a target. Vacuum deposition, ion plating, and the like may be used instead of sputtering. The bismuth oxide layer may alternatively be formed as a third layer 23 by applying a paste including a bismuth oxide powder to the second layer 22, drying the resulting coating film, and performing a heat treatment at a relatively low temperature (e.g., 200° C. to 700° C. and preferably 200° C. to 500° C.). In the case where the bismuth oxide layer includes a subcomponent, the bismuth oxide layer may be formed as a third layer 23 on the second layer 22 by multi-target simultaneous sputtering using bismuth oxide and the subcomponent as targets. The bismuth oxide layer may alternatively be formed as a third layer 23 by applying a paste including a bismuth oxide powder and a powder of the subcomponent to the second layer 22, drying the resulting coating film, and performing a heat treatment at a relatively low temperature. Strontium oxide and praseodymium oxide may be used instead of bismuth oxide.

Preparation of Electrodes 14 and 16 (See Step (d) of FIG. 2)

The electrodes 14 and 16 may be prepared by depositing an electrode material on both surfaces of the resistor 20 including the first layer 21 to the third layer 23 by vapor deposition or sputtering. Examples of the electrode material include gold, silver, platinum, and aluminum. In another case, tabular electrodes 14 and 16 may be bonded onto the respective surfaces of the resistor 20 with a conductive bonding agent.

The voltage-nonlinear resistor element 10, which is described above in detail, includes a first layer 21 composed primarily of zinc oxide, a third layer 23 composed primarily of a metal oxide other than zinc oxide, and a second layer 22 interposed therebetween which is composed primarily of zinc oxide and has a smaller thickness and a higher volume resistivity than the first layer 21. The presence of the second layer 22 increases the voltage nonlinearity index of the voltage-nonlinear resistor element compared with the voltage-nonlinear resistor elements of the related art and, as a result, reduces the amount of current that flows through the voltage-nonlinear resistor element 10 connected in shunt with a circuit that is to be protected during normal operation, that is, while the amount of voltage is low. This reduces energy consumption.

The present invention is not limited by the above-described embodiment. It is needless to say that the present invention may be implemented in various embodiments within the scope of the present invention.

For example, while the above-described voltage-nonlinear resistor element 10 includes electrodes 14 and 16 disposed on the respective surfaces of one resistor 20, the electrodes may alternatively be disposed on the respective surfaces of a multilayer structure constituted by a plurality of resistors 20 stacked on top of one another. Using such a multilayer resistor enables the control of the varistor voltage and the production of a voltage-nonlinear resistor element having a varistor voltage suitable for the intended purpose.

EXAMPLE

Example 1

To zinc oxide (average particle diameter: 1.5 μm), 1% by mass of gallium oxide (average particle diameter: 0.02 μm) was added. The resulting mixture was wet-blended, and evaporation drying was subsequently performed. The dried powder was passed through a sieve having an opening of 75 μm and subsequently formed into a compact. The compact was degreased and held at 1100° C. for 5 hours in a $N_2$ atmosphere. The compact was subsequently heated to 1300° C. and fired for 5 hours. Thus, a zinc oxide ceramic block was prepared. The zinc oxide ceramic block had a volume resistivity of $6.0 \times 10^{-4}$ Ωcm. The volume resistivity of the zinc oxide ceramic block was measured by a four-terminal method.

A tabular piece having a size of 5 mm×5 mm×1 mm was cut from the zinc oxide ceramic block to form a zinc oxide ceramic sheet. After the upper surface of the sheet had been polished and cleaned, the sheet was held at 800° C. for 0.5 hours in an oxygen atmosphere. Thus, a zinc oxide ceramic sheet with each surface layer being oxidized was prepared. The surface layers of the sheet had a volume resistivity of $2.0 \times 10^{-3}$ Ωcm and a thickness of 0.2 (nm). The inside of the zinc oxide ceramic sheet, which was a portion of the zinc oxide ceramic sheet which was other than the surface layers, corresponded to the first layer, and the surface layer corresponded to the second layer. The volume resistivity of the second layer was measured by a four-terminal method (terminal interval: 10 μm). The thickness of the second layer was measured in the following manner. Specifically, a zinc oxide ceramic sheet was held in an oxygen ($^{18}O$) atmosphere under the same conditions as described above (i.e., at 800° C. for 0.5 hours), and the depth profile of $^{18}O$ in the zinc oxide ceramic sheet was measured with a secondary ion mass spectrometer in order to determine the thickness of the second layer. The thickness of the second layer can be determined from the depth profile of $^{18}O$, because the zinc oxide ceramic sheet is oxidized by $^{18}O$ when heated in an atmosphere including $^{18}O$, which is an isotope of $^{16}O$, while the oxygen atoms included in the zinc oxide ceramic sheet are $^{16}O$.

A sputtered film (thickness: 0.3 µm) composed of an oxide including bismuth, manganese, and cobalt was formed on the upper surface of the zinc oxide ceramic sheet by high-frequency plasma sputtering using an oxide including bismuth, manganese, and cobalt as a target (metal element ratio of bismuth:manganese:cobalt=60:20:20). The sputtered film corresponded to the third layer. A resistor having a three-layer structure was formed in the above-described manner. For performing sputtering, RFS-200 produced by ULVAC KIKO, Inc. was used. Film deposition was performed under the following conditions: target size, diameter: 80 mm, RF output: 40 W, gas pressure ($O_2$): 5.0 Pa, film deposition time: 120 minutes.

An Al electrode was formed on each surface of the resistor by vapor deposition. Thus, a voltage-nonlinear resistor element was formed. A voltage was applied between the two electrodes of the voltage-nonlinear resistor element in order to determine the current-voltage characteristic of the element. The electrode disposed on the zinc oxide ceramic sheet-side served as an anode. The electrode disposed on the sputtered film including bismuth oxide served as a cathode. The current-voltage characteristic of the element was measured with Agilent B2901A produced by Agilent Technologies in accordance with IEC61051-1. The voltage nonlinearity index of the element in the range of 1 µA to 1 mA was determined using Formula (1) below on the basis of the current-voltage characteristic. In Formula V1 µA represents the voltage at a current of 1 µA, and V1 mA represents the voltage at a current of 1 mA. The voltage nonlinearity index of the element which was determined in the above-described manner was 24. Table 1 shows the properties and the voltage nonlinearity index of the element prepared in Example 1. Table 1 also shows the properties and the voltage nonlinearity index of the element prepared in each of Examples 2 to 4 and Comparative Examples 1 to 3 below.

$$\text{Voltage Nonlinearity index} = \log(1 \, \mu A / 1 \, mA) / \log(V1 \, \mu A / V1 \, mA) \quad (1)$$

Example 2

A voltage-nonlinear resistor element was prepared as in Example 1, except that, after the upper surface of the zinc oxide ceramic sheet had been polished and cleaned, the zinc oxide ceramic sheet was held at 900° C. for 0.5 hours in an oxygen atmosphere. The second layer had a thickness of 2 nm. The voltage nonlinearity index of the element in the range of 1 µA to 1 mA which was determined from the current-voltage characteristic of the element was 24. Table 1 shows the properties and the voltage nonlinearity index of the element prepared in Example 2.

Example 3

A voltage-nonlinear resistor element was prepared as in Example 1, except that the amount of gallium oxide added to zinc oxide was changed to 0.05% by mass. The volume resistivities of the first layer and the second layer were $6 \times 10^{-3}$ Ωcm and $3 \times 10^{-2}$ Ωcm, respectively. The voltage nonlinearity index of the element in the range of 1 µA to 1 mA which was determined from the current-voltage characteristic of the element was 18. Table 1 shows the properties and the voltage nonlinearity index of the element prepared in Example 3.

Example 4

A zinc oxide ceramic block was prepared as in Example 1, and a zinc oxide ceramic sheet was cut from the zinc oxide ceramic block. A sputtered film that was composed of zinc oxide and had a thickness of 300 nm was formed on the upper surface of the zinc oxide ceramic sheet by high-frequency plasma sputtering using zinc oxide as a target. The zinc oxide ceramic sheet corresponded to the first layer. The zinc oxide-sputtered film corresponded to the second layer. For performing sputtering, RFS-200 produced by ULVAC KIKO, Inc. was used. Film deposition was performed under the following conditions: target size, diameter: 80 mm, RF output: 40 W, gas pressure ($N_2$): 5.0 Pa, film deposition time: 150 minutes.

The zinc oxide-sputtered film had a volume resistivity of $3 \times 10^2$ (Ωcm) and a thickness of 300 (nm). Subsequently, a film composed of an oxide including bismuth, manganese, and cobalt was formed on the zinc oxide-sputtered film as in Example 1. This sputtered film corresponded to the third layer. A resistor having a three-layer structure was formed in the above-described manner. An Al electrode was formed on each surface of the resistor by vapor deposition. Thus, a voltage-nonlinear resistor element was formed. The voltage nonlinearity index of the element in the range of 1 µA to 1 mA which was determined from the current-voltage characteristic of the element was 11. Table 1 shows the properties and the voltage nonlinearity index of the element prepared in Example 4.

The volume resistivity of the zinc oxide-sputtered film was determined by forming a zinc oxide-sputtered film having the same composition as that prepared in Example 2

TABLE 1

| | First layer | | | Second layer | | | | | |
|---|---|---|---|---|---|---|---|---|---|
| | Principal component | Sub-component | Volume resistivity (Ω cm) | Principal component | Sub-component | Thickness | Volume resistivity (Ω cm) | Third layer Components | Voltage Nonlinearity Index |
| Example 1 | ZnO | $Ga_2O_3$ | $6 \times 10^{-4}$ | ZnO | $Ga_2O_3$ | 0.2 (nm) | $2 \times 10^{-3}$ | $Bi_2O_3$, $Co_2O_3$, $MnO_2$ | 24 |
| Example 2 | ZnO | $Ga_2O_3$ | $6 \times 10^{-4}$ | ZnO | $Ga_2O_3$ | 2 (nm) | $2 \times 10^{-3}$ | $Bi_2O_3$, $Co_2O_3$, $MnO_2$ | 24 |
| Example 3 | ZnO | $Ga_2O_3$ | $6 \times 10^{-3}$ | ZnO | $Ga_2O_3$ | 0.2 (nm) | $3 \times 10^{-2}$ | $Bi_2O_3$, $Co_2O_3$, $MnO_2$ | 18 |
| Example 4 | ZnO | $Ga_2O_3$ | $6 \times 10^{-4}$ | ZnO | $Ga_2O_3$ | 300 (nm) | $3 \times 10^2$ | $Bi_2O_3$, $Co_2O_3$, $MnO_2$ | 11 |
| Example 5 | ZnO | $Ga_2O_3$ | $6 \times 10^{-4}$ | ZnO | $Ga_2O_3$ | 0.2 (nm) | $2 \times 10^{-3}$ | $Bi_2O_3$, $Co_2O_3$ | 11 |
| Example 6 | ZnO | $Ga_2O_3$ | $6 \times 10^{-4}$ | ZnO | $Ga_2O_3$ | 0.2 (nm) | $2 \times 10^{-3}$ | $Pr_6O_{11}$, $Co_2O_3$ | 10 |
| Comparative Example 1 | ZnO | $Ga_2O_3$ | $6 \times 10^{-4}$ | — | — | — | — | $Bi_2O_3$, $Co_2O_3$, $MnO_2$ | 3 |
| Comparative Example 2 | ZnO | — | $6 \times 10^{-2}$ | ZnO | — | 0.2 (nm) | $2 \times 10^{-3}$ | $Bi_2O_3$, $Co_2O_3$, $MnO_2$ | 8 |
| Comparative Example 3 | ZnO | $Ga_2O_3$ | $6 \times 10^{-4}$ | ZnO | $Ga_2O_3$ | 1 (mm) | $3 \times 10^2$ | $Bi_2O_3$, $Co_2O_3$, $MnO_2$ | 7 | on a glass substrate under the same conditions as in Example 2 and subjecting the glass substrate including the zinc oxide-sputtered film to an apparatus produced by TOYO Corporation (product name: ResiTest8300). The thickness of the second layer was determined by observing the three-layer structure with a TEM (transmission electron microscope. The difference in the crystallographic orientation of zinc oxide between the first layer and the second layer made it possible to determine the boundary between the first and second layers with a TEM. The difference in the type of elements between the second layer and the third layer made it possible to determine the boundary between the second and third layers with a TEM.

Example 5

A voltage-nonlinear resistor element was prepared as in Example 1, except that, in the formation of the third layer, an oxide including bismuth and cobalt (metal element ratio of bismuth:cobalt=50:50) was used as a target. The voltage nonlinearity index of the element in the range of 1 μA to 1 mA which was determined from the current-voltage characteristic of the element was 11. Table 1 shows the properties and the voltage nonlinearity index of the element prepared in Example 5.

Example 6

A voltage-nonlinear resistor element was prepared as in Example 1, except that, in the formation of the third layer, an oxide including praseodymium and cobalt (metal element ratio of praseodymium:cobalt=50:50) was used as a target. The voltage nonlinearity index of the element in the range of 1 μA to 1 mA which was determined from the current-voltage characteristic of the element was 10. Table 1 shows the properties and the voltage nonlinearity index of the element prepared in Example 6.

Comparative Example 1

A resistor was prepared as in Example 1, except that the step of oxidizing each surface layer of the zinc oxide ceramic sheet was omitted. This resistor had a two-layer structure that did not include the second layer. An Al electrode was formed on each surface of the resistor by vapor deposition. Thus, a voltage-nonlinear resistor element was formed. The voltage nonlinearity index of the element in the range of 1 μA to 1 mA which was determined from the current-voltage characteristic of the element was 3. Table 1 shows the properties and the voltage nonlinearity index of the element prepared in Comparative Example 1.

Comparative Example 2

A voltage-nonlinear resistor element was prepared as in Example 1, except that the zinc oxide ceramic block was prepared using only zinc oxide, that is, without using gallium oxide, as a raw material of the zinc oxide ceramic block, and a zinc oxide ceramic sheet was cut from the block. The inside (i.e., the first layer) of the zinc oxide ceramic sheet had a lower volume resistivity than the surface layer (i.e., the second layer) of the zinc oxide ceramic sheet. The voltage nonlinearity index of the element in the range of 1 μA to 1 mA which was determined from the current-voltage characteristic of the element was 8. Table 1 shows the properties and the voltage nonlinearity index of the element prepared in Comparative Example 2.

Comparative Example 3

A voltage-nonlinear resistor element was prepared as in Example 2, except that the thickness of the zinc oxide-sputtered film was changed to be 1 mm when the sputtered film was formed on the upper surface of the zinc oxide ceramic sheet. The voltage nonlinearity index of the element in the range of 1 μA to 1 mA which was determined from the current-voltage characteristic of the element was 7. Table 1 shows the properties and the voltage nonlinearity index of the element prepared in Comparative Example 3.

Examples above are merely examples of the present invention and do not limit the present invention.

The present application claims priority from Japanese Patent Application No. 2016-063624, filed on Mar. 28, 2016, the entire contents of which are incorporated herein by reference.

What is claimed is:

1. A voltage-nonlinear resistor element comprising:
a first layer composed primarily of zinc oxide;
a second layer adjacent to the first layer, the second layer being composed primarily of zinc oxide and having a smaller thickness and a higher volume resistivity than the first layer; and
a third layer adjacent to the second layer on a side of the second layer which is opposite to the side on which the second layer is adjacent to the first layer, the third layer being composed primarily of a metal oxide other than zinc oxide.

2. The voltage-nonlinear resistor element according to claim 1,
wherein the first layer has a volume resistivity of $1 \times 10^{-2}$ Ωcm or less, and
wherein the second layer has a volume resistivity that is higher than the volume resistivity of the first layer and $1 \times 10^{3}$ Ωcm or less.

3. The voltage-nonlinear resistor element according to claim 1,
wherein the second layer has a thickness of 0.2 to 300 nm.

4. The voltage-nonlinear resistor element according to claim 1,
wherein the first layer includes an oxide of at least one metal element selected from the group consisting of Al, Ga, and In.

5. The voltage-nonlinear resistor element according to claim 1,
wherein the third layer is composed primarily of an oxide of a metal element selected from the group consisting of Sr, Bi, and Pr and includes an oxide of at least one metal element selected from the group consisting of Si, Cr, Mn, Co, Ni, Zn, Sb, and La.

6. A method for producing the voltage-nonlinear resistor element according to claim 1, the method comprising:
(a) firing a compact formed of a zinc oxide powder that may include at least one metal element selected from the group consisting of Al, Ga, and in In a nonoxidizing atmosphere in order to prepare a zinc oxide ceramic substrate;
(b) firing the zinc oxide ceramic substrate in an oxidizing atmosphere in order to convert a surface layer of the zinc oxide ceramic substrate into a layer having a higher volume resistivity than the inside of the zinc oxide ceramic substrate, the inside and the surface layer of the zinc oxide ceramic substrate serving as the first layer and the second layer, respectively; and (c) forming the third layer on a surface of the second layer.

7. A method for producing the voltage-nonlinear resistor element according to claim 1, the method comprising:

(a) firing a compact formed of a zinc oxide powder that may include at least one metal element selected from the group consisting of Al, Ga, and In in a nonoxidizing atmosphere in order to prepare a zinc oxide ceramic substrate;

(b) forming a zinc oxide layer on a surface of the zinc oxide ceramic substrate, the zinc oxide layer being composed primarily of zinc oxide and having a smaller thickness and a higher volume resistivity than the zinc oxide ceramic substrate, the zinc oxide ceramic substrate and the zinc oxide layer serving as the first layer and the second layer, respectively; and (c) forming the third layer on a surface of the second layer.

\* \* \* \* \*